US010748740B2

(12) United States Patent
De Groot et al.

(10) Patent No.: US 10,748,740 B2
(45) Date of Patent: Aug. 18, 2020

(54) X-RAY AND PARTICLE SHIELD FOR IMPROVED VACUUM CONDUCTIVITY

(71) Applicant: FEI Company, Hillsboro, OR (US)

(72) Inventors: Rients Jan De Groot, Heeze (NL); Casper Smit, Eindhoven (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 16/106,914

(22) Filed: Aug. 21, 2018

(65) Prior Publication Data

US 2020/0066479 A1 Feb. 27, 2020

(51) Int. Cl.
*H01J 37/00* (2006.01)
*H01J 37/16* (2006.01)
*G21F 1/08* (2006.01)

(52) U.S. Cl.
CPC ............ *H01J 37/165* (2013.01); *G21F 1/085* (2013.01)

(58) Field of Classification Search
USPC ...................................................... 250/515.1
See application file for complete search history.

(56) References Cited

U.S. PATENT DOCUMENTS

| 2,981,786 | A | * | 4/1961 | Beeney | H01J 5/12 |
| | | | | | 174/395 |
| 3,239,424 | A | | 3/1966 | Wilfred et al. | |
| 3,322,993 | A | * | 5/1967 | Miroslav Vinopal | H01J 7/186 |
| | | | | | 313/553 |
| 4,322,653 | A | * | 3/1982 | Bader | H01J 35/04 |
| | | | | | 313/240 |
| 4,750,805 | A | * | 6/1988 | Vaderwall | G02B 6/443 |
| | | | | | 174/109 |
| 5,038,370 | A | * | 8/1991 | Harding | G21K 1/043 |
| | | | | | 378/146 |
| 6,749,337 | B1 | * | 6/2004 | Artig | H01J 9/24 |
| | | | | | 378/121 |
| 7,773,726 | B2 | * | 8/2010 | Inazuru | H01J 35/08 |
| | | | | | 378/119 |
| 7,949,099 | B2 | * | 5/2011 | Klinkowstein | H05G 1/10 |
| | | | | | 378/121 |
| 2012/0170716 | A1 | | 7/2012 | Chen et al. | |
| 2014/0270091 | A1 | | 9/2014 | Nemeth et al. | |
| 2016/0233050 | A1 | | 8/2016 | Kasuya et al. | |
| 2019/0148102 | A1 | * | 5/2019 | Maltz | H01J 35/18 |
| | | | | | 378/130 |

FOREIGN PATENT DOCUMENTS

EP 0535870 A1 4/1993
JP S1632947 A 2/1986

OTHER PUBLICATIONS

EP19192034.7, Extended Search Report, Jan. 23, 2020, 8 pages.

* cited by examiner

*Primary Examiner* — Phillip A Johnston

(57) ABSTRACT

An x-ray shield for improved vacuum conductivity is disclosed herein. An example x-ray shield includes at least one elongate member formed from high atomic weight material shaped into a twist with at least 180° of twist.

22 Claims, 4 Drawing Sheets

X-RAY AND PARTICLE SHIELD FOR IMPROVED VACUUM CONDUCTIVITY

FIELD OF THE INVENTION

This application is generally directed toward x-ray shielding, and more specifically to x-ray shielding in high vacuum environments.

BACKGROUND OF THE INVENTION

Many industrial systems generate harmful radiation during operation, which demands safety precautions for the protection of equipment operators. For example, systems that generate and use x-rays require various types and quantities of shielding to limit or prevent exposure to humans and/or animals. The shielding usually includes strategically placed high atomic weight materials to absorb or block the radiation before exiting the equipment and exposing users in the vicinity. Such shielding, however, can be costly and difficult to incorporate into or on the equipment.

FIG. 1 is an example high vacuum system 100 that includes x-ray shielding. The system 100 may generate x-rays in the high vacuum chamber. In some examples, the x-rays are generated due to electron beam interaction with a metal, for example. The x-ray shielding is placed in and around a vacuum tube coupling a high vacuum chamber to a vacuum pump to block x-rays from exiting the chamber. In general, the generated x-rays may be emitted in any of the 47 steradians, but x-rays directed toward the vacuum tube may be of most concern due to the complexities of providing x-ray shielding to the juncture of the chamber and the vacuum tube. The x-rays emitted toward the vacuum tube may be from various angles, which may be due to direct emission from the electron beam/metal interaction or due to reflections within the chamber. If the x-ray shield was not present, however, x-rays may pass through the chamber wall and/or the vacuum tube wall, which is not desirable. A further concern with the vacuum tube is the need for vacuum pump access to the chamber for obtaining a high vacuum environment while still shielding for x-rays. The need to include the x-ray shield in and around the vacuum tube/chamber junction creates a tradeoff between vacuum conductance and x-ray safety. Vacuum conductance being a measurement of how quickly the chamber may be evacuated to a desired pressure and the ultimate pressure in the high vacuum chamber, for example.

One technique to reduce or eliminate instances of x-rays escaping the chamber and/or vacuum tube is to include the x-ray shielding shown in FIG. 1. The x-ray shielding includes portions outside of the walls of the chamber and the tubing, portions inside at least a portion of the tubing, and a disc placed in front of the tubing. The front view shows the two components of the x-ray shielding with the patterned area being the open area for gas flow during pumping. The arrangement of the disc in front of the tubing essentially creates a labyrinth for the x-rays emitted toward the vacuum tube to travel through before entering the vacuum tube. However, this is also a labyrinth for the gas molecules in the high vacuum chamber to travel to be removed by the vacuum pump. The labyrinth created by the x-ray shielding, at least as it affects gas molecules, reduces the vacuum conductance of the system. The reduction in vacuum conductance results in slower pump times, which may be addressed using more powerful vacuum pumps, and a higher vacuum pressure in the high vacuum chamber than with a good conductance towards it (in the molecular flow regime). Yet, such a solution may at least affect costs, space requirements, and add undesirable vibrations. As such, effective x-ray shielding that allows for increased vacuum conductance is desirable.

SUMMARY

X-ray shields that provide enhanced vacuum conductivity and systems implementing such x-ray shield are disclosed herein and that address the problems discussed above. An example x-ray shield may be an elongate member formed from high atomic weight material shaped into a twist with at least 180° of twist. In some embodiments, the twist can be at least 210°. In other embodiments, the x-ray shield may be formed from two twisted elongate members. The x-ray shield may be formed to fit within a vacuum tube coupling a high vacuum chamber to a vacuum pump and to prevent or reduce x-rays from exiting the high vacuum chamber.

In some embodiments, the high atomic weight material may be lead or a material including sintered tungsten particles. Additionally, in some embodiments, the elongate member may be coated with a low atomic weight material, such as aluminum for example.

In some embodiments, the x-ray shield may be biased positively or negatively to attract charged particles, such as ions, impacting the x-ray shield from either a pump side or a chamber side. In other embodiments, the x-ray shield may be cooled to attract and trap gasses.

BRIEF DESCRIPTION OF THE DRAWINGS

Like reference numerals refer to corresponding parts throughout the several views of the drawings.

DETAILED DESCRIPTION OF EMBODIMENTS

Embodiments of the present invention are described below in the context of a high vacuum environment where x-rays are generated that requires blocking of x-rays while maintaining high vacuum conductance. However, it should be understood that the methods described herein are generally applicable to a wide range of different tomographic methods and apparatus, including both cone-beam and parallel beam systems, and are not limited to any particular apparatus type, beam type, object type, length scale, or scanning trajectory As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatuses are referred to as "lowest", "best", "minimum," or the like. It will be appreciated that such descriptions are intended to indicate that a selection among many used functional alternatives can be made, and such selections need not be better, smaller, or otherwise preferable to other selections.

Figure 2:
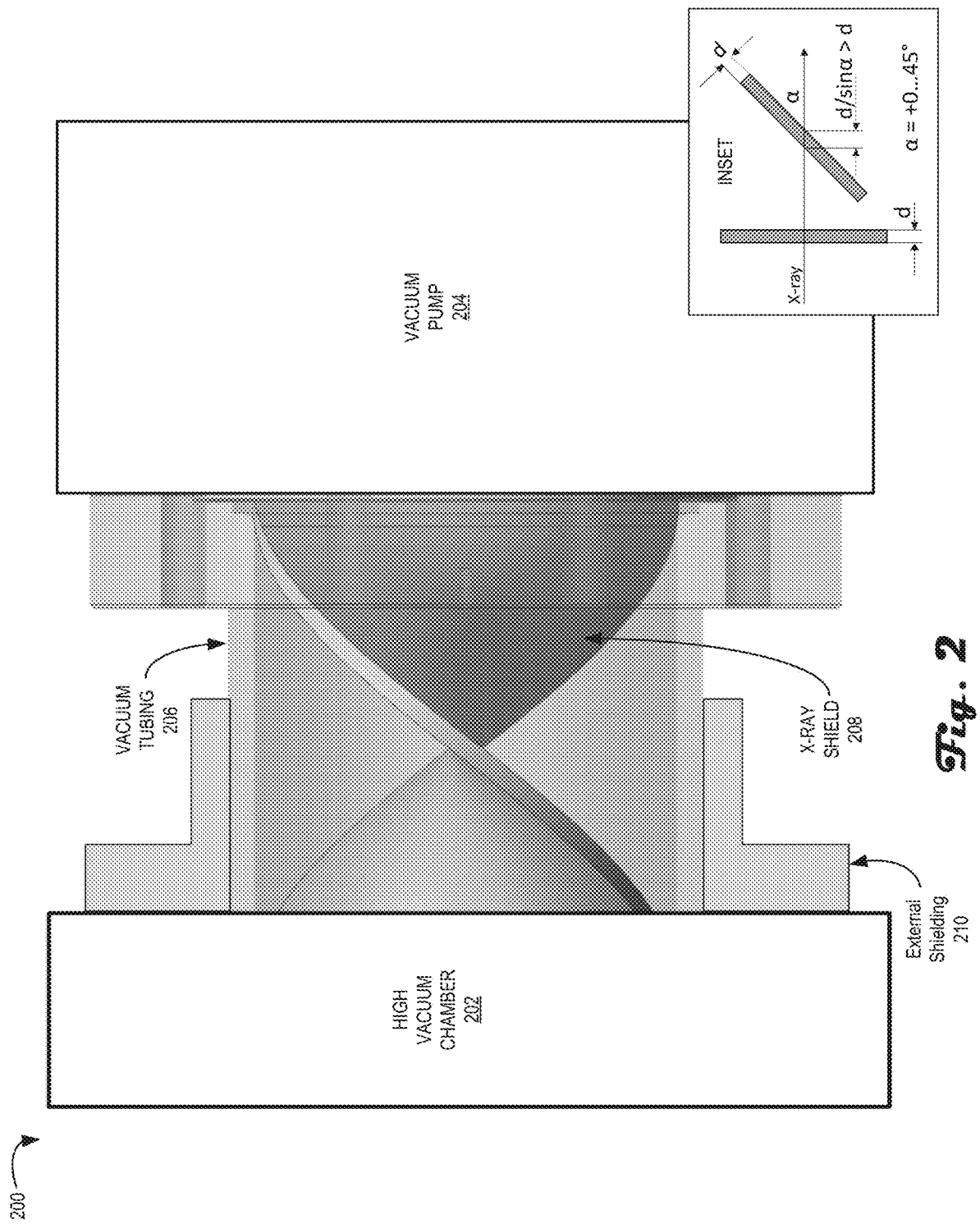
FIG. 2 is an example high vacuum system in accordance with an embodiment of the present disclosure.

FIG. 2 is an example high vacuum system 200 in accordance with an embodiment of the present disclosure. The high vacuum system 200, system 200 for short, at least includes a high vacuum chamber 202, a vacuum pump 204, vacuum pump tubing 206, x-ray shield 208, and portions of external shielding 210. The high vacuum chamber 202 may be part of a charged particle microscope in some instances, but the disclosure is not limited in this aspect. A few examples of charged particle microscopes include transmission electron microscopes, scanning electron microscopes, scanning transmission electron microscopes, focused ion beam systems, and combinations thereof. Such charged particle microscopes may require high vacuum levels, e.g., very low pressures, for desired operation. For example, charged particle microscopes may operate with pressures of $10^{-5}$ to $10^{-10}$ torr.

The vacuum pump 204 may be any type of pump in the industry, such as mechanical pumps, diffusion pumps, ion pumps, turbo molecular pumps, and the like. In some embodiments, there may be multiple pumps coupled to the high vacuum chamber 202. For example, a roughing pump and a high vacuum pump may be coupled to the high vacuum chamber 202 through various tubing and valves. The vacuum pump 204 is coupled to the high vacuum chamber 202 by the vacuum pump tube 206. The vacuum pump tube 206 may be of various lengths and inner geometries, such as diameters. Of course, other inner geometries other than cylindrical are contemplated herein, such as oval, square, rectangle, etc. In some embodiments (not shown), the vacuum pump tube 206 may have portions that are of larger inner diameter and portions of smaller inner diameter with a transition region there between. The changes in diameter may be included due to respective diameters of ports of the high vacuum chamber 202 and the vacuum pump 204, for example.

The x-ray shield 208 may be placed inside the tubing connecting the vacuum pump 204 to the vacuum chamber 202, which may be referred to herein as vacuum pump tubing 206, to block the escape of x-rays generated in the high vacuum chamber 202 and emitted in the direction of the vacuum pump 204/vacuum pump tubing 206. The x-ray shield 208 may be formed from one or more twisted elongate members. For example, the x-ray shield 208 may be formed from a flat bar that is twisted by a desired degree of twist, the degree of twisting ranging from 180° to 360°. In some embodiments, the degree of twist is 210°, 225°, or 270°. In general, the degree of twist, in conjunction with a pitch of the twist, e.g., rate of twist, and a thickness of the x-ray shield 208 may desirably reduce or prevent line-of-sight trajectories between the high vacuum chamber 202 and the vacuum pump 204 and/or portions of the vacuum tube 206 not protected by external x-ray shielding. Additionally, the degree of twist may also depend on the arrangement of the x-ray shield 208, e.g., whether it is formed from a single flat bar or whether it is formed from multiple flat bars (see FIG. 5 for an example), with a greater number of members of the x-ray shield 208 reducing the minimum degree of twist to provide a desired level of x-ray shielding. Further, while the x-ray shield 208 is shown as a standalone component placed inside tubing 206, in other embodiments, x-ray shield 208 may be integrated with a component of the system 200, such as a wall of the vacuum chamber 202, inside and part of tubing 206, or even as a part of an input port of vacuum pump 204. However, the location and integration of the x-ray shield 208 is not limiting and all configurations are contemplated herein.

The elongate member forming the x-ray shield 208 has a width, length and thickness in addition to the twist feature. The width is determined by an inner diameter of the vacuum tube 206, and the length may be determined by the length of the vacuum tube 206. It should be noted, however, that the length of the x-ray shield will likely be less than the length of the vacuum tube 206 in some embodiments. In general, the length of the x-ray shield 208 may be based on an amount of twist, in that the length may be minimized to ensure desired x-ray shielding giving a degree of twist. A thickness of the x-ray shield 208 may be based on the material used to form the x-ray shield, but may also be thinner than the disc shown in FIG. 1. Because the x-ray shield is twisting, impinging x-rays will hit the x-ray shield 208 at an angle, which provides a thicker interaction volume than hitting the x-ray shield 208 at a normal angle—see insert where thickness is labeled "d".

The x-ray shield 208 may be formed from high atomic weight materials to reduce or prevent transmission of x-rays, or other high energy photons and particles, from escaping the system 200. For example, the x-ray shield 208 may be formed from lead, metals formed from sintered tungsten particles, such as Densimet® or Inermet®, or the like. While there are other heavy metals that could be added to the list, the x-ray shield 208 may desirably be formed from less expensive materials in most embodiments. However, more expensive metals are contemplated herein. Additionally, the x-ray shield 208 may be coated with a low-z material, aluminum for example, to reduce x-rays generated by the x-ray shield 208 when struck by high energy particles or x-rays of high energy. In some embodiments, a thin coat of the low-z material may be implemented, around 0.2 mm in thickness for example. Coating the x-ray shield 208 with a layer of low-z material may allow a thickness of the vacuum tube 206 to be thinner due to a reduction in x-ray generation within the vacuum tube 206.

X-rays entering the vacuum pump tubing 206 from the chamber 202 may impact the x-ray shield 208. Because the x-ray shield 208 is twisted, the x-rays impact at an angle different from perpendicular. As such, an effective thickness of the x-ray shield 208 is thicker due to the geometry—see inset. While external shielding around the chamber 202 and the vacuum pump tubing 206 are not shown in FIG. 2, such shielding would be present. For example, shielding surrounding at least a part of the chamber 202 and the tubing 206 would be included in most, if not all, embodiments of the system 200.

Figure 1:
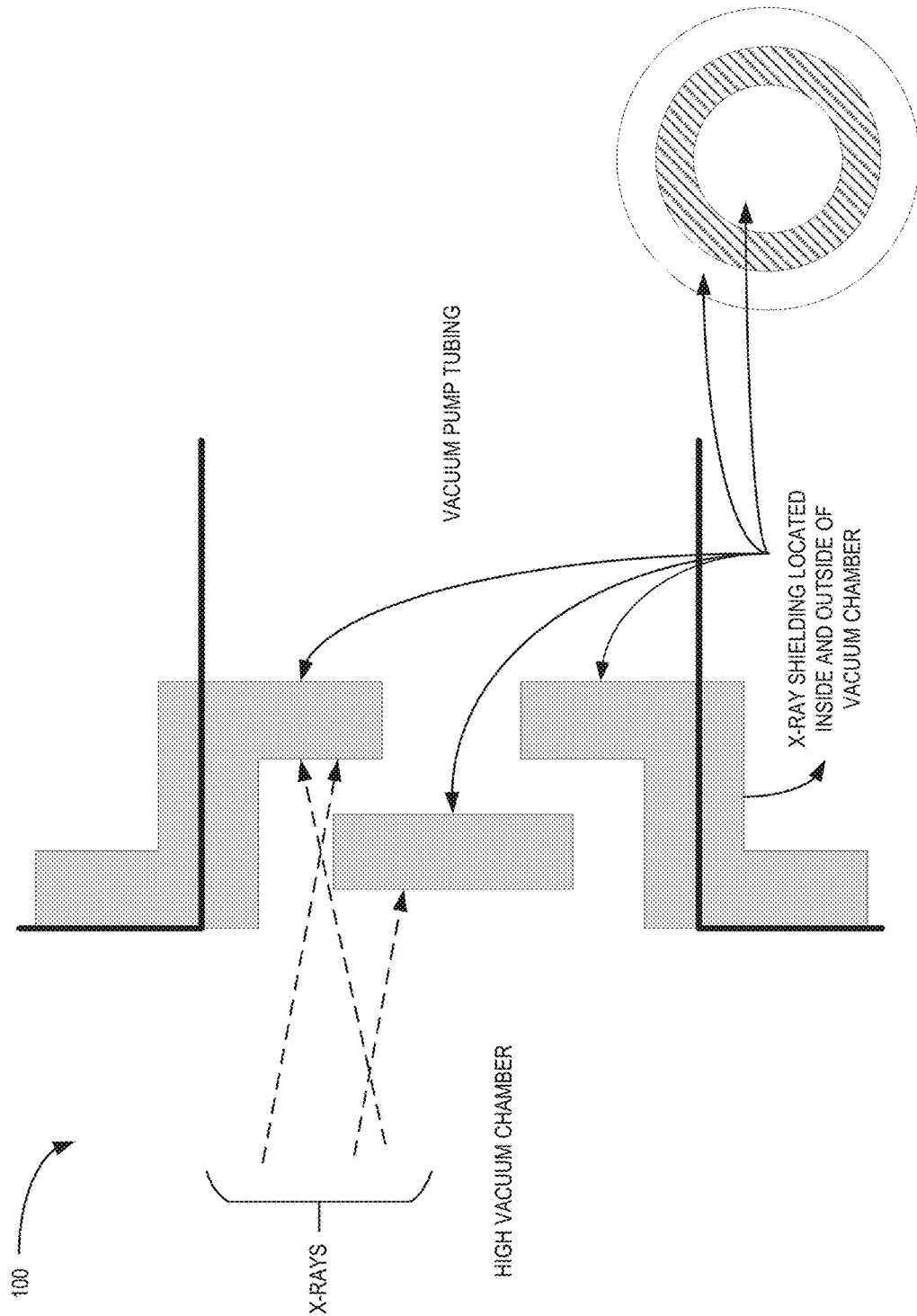
FIG. 1 is an example high vacuum system that includes x-ray shielding.

In comparison to the x-ray shield of FIG. 1, the x-ray shield 208 provides increase vacuum conductance. The increased inductance is at least attributable to the lack of direct blocking of gas molecules due to a lack of the disc of FIG. 1. Instead of the disc, the x-rays are blocked by hitting twisting x-ray shield. The twist aspect of the x-ray shield also provides the increased vacuum conductance because gasses moving out of the chamber 202 under the influence of the vacuum pump 204 have less resistance to movement than the disc-based x-ray shield provides. In some embodiments, the vacuum conductance is increased by as much as 31%.

In addition or alternative, in some embodiments, the x-ray shield 208 may be biased positively or negatively to attract charged particles. For example, ions emitted by an ion pump implemented as the pump 204 may be trapped by a biased x-ray shield 208 instead of entering the vacuum chamber 202. For another example, a biased x-ray shield 208 may attract ions entering from the vacuum chamber 202, which may be generated in a focused ion beam system or a dual beam system, e.g., combination electron and focused ion beam system.

In some embodiments, the x-ray shield 208 may be cooled through thermal couplings, which would further improve pumping efficiency by attracting gasses in the vacuum chamber 202. For example, the x-ray shield 208 can be cooled to liquid nitrogen temperature.

Figure 3B:
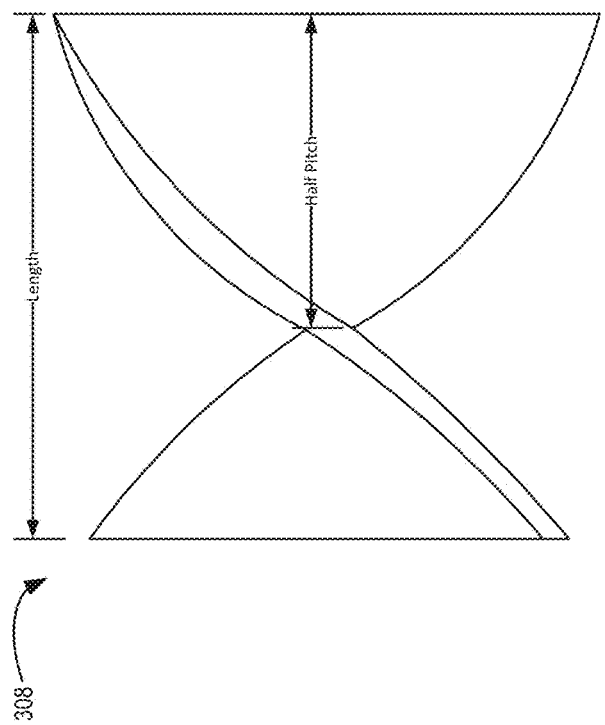
FIGS. 3A and 3B are example schematics of an x-ray shield in accordance with an embodiment of the present disclosure.
Figure 3A:
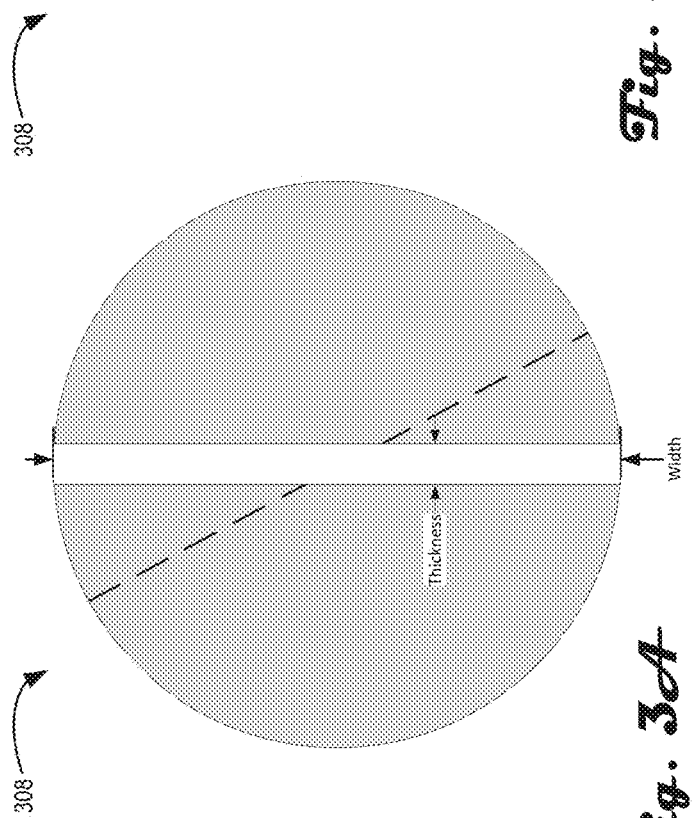

FIGS. 3A and 3B are example schematics of an x-ray shield 308 in accordance with an embodiment of the present disclosure. The x-ray shield 308 may be implemented in any high vacuum system, such as the system 200, for example. The x-ray shield 308 may be placed in vacuum tubing fluidly coupling a vacuum chamber and a vacuum pump, and is included to prevent the emission of x-rays or other high energy photons from the vacuum chamber.

The x-ray shield 308 may be formed from an elongate member, e.g., a semi-flat bar, which is twisted to a desired degree of twist. The dashed line represents the location of the other end of the x-ray shield 308. The degree of twist may be from 180° to greater than 360°. In some embodiments, the angle of twist may be 210°. As with the x-ray shied 208, the x-ray shield 308 has a thickness, a length, a width, and a pitch. Only half a pitch is shown in FIG. 3B due to the length not including 360° of twist. All or some of the dimensions may be determined based on the vacuum tube the x-ray shield 308 is to be inserted. For example, the width may be determined based on an inner diameter of a vacuum tube that x-ray shield will be inserted. The width may be set slightly less than the inner diameter so that the x-ray shield 308 fits into the vacuum tube. The length may also be determined by the vacuum tubing. For example, if the vacuum tube is short, then the length will be selected to fit into the vacuum tube without interfering with the chamber or the vacuum pump. Additionally, the length may also be based on a desired amount of twist and the pitch of the twist, e.g., rate of twist. For example, if a large pitch is desired and the degree of twist is greater than 275°, then the length may need to be long enough to accommodate the pitch and the degree of twist. The thickness may be determined based on the high atomic number material used to from the x-ray shield 308 along with the other dimensions. The material used may affect the thickness based on the x-ray absorbing/blocking characteristics. For example, a less capable material may require more thickness over a more capable material. Example thicknesses include 5 mm, 10 mm, 15 mm, and more.

Additionally, the width of the x-ray shield 308 may change along the length to accommodate vacuum tubes that have multiple inner diameters to account for. For example, if the vacuum tube has a portion at a first inner diameter that transitions to a portion of a second inner diameter, the x-ray shield 308 may also be formed to have two different widths with a transition region there between so that the x-ray shield 308 fits within both portions and the transition region of the vacuum tube.

Figure 4B:
FIGS. 4A and 4B illustrate the empty volume remaining between the example x-ray shield of FIGS. 3A and 3B and vacuum tubing in accordance with an embodiment of the present disclosure.
Figure 4A:
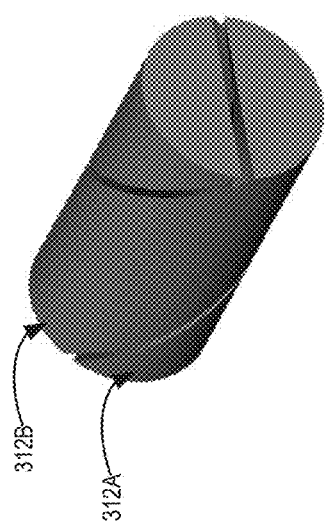

Further, to ensure a high pump conductance while providing the desired x-ray protection, the length and pitch may be formed to maximize the empty volume of space between the x-ray shield 308 and the surrounding tubing while maintaining the desired x-ray protection. For example, FIGS. 4A and 4B illustrate the empty volume remaining between an example x-ray shield 308 and vacuum tubing (not shown) in accordance with an embodiment of the present disclosure. FIG. 4A illustrates an example of two volumes 312A and 312B that twist around each other, and FIG. 4b illustrates a single volume 312A. The empty volume provides the pathway for pumping gas out of the chamber, where the removal of the gas reduces the pressure in the chamber.

Figure 5B:
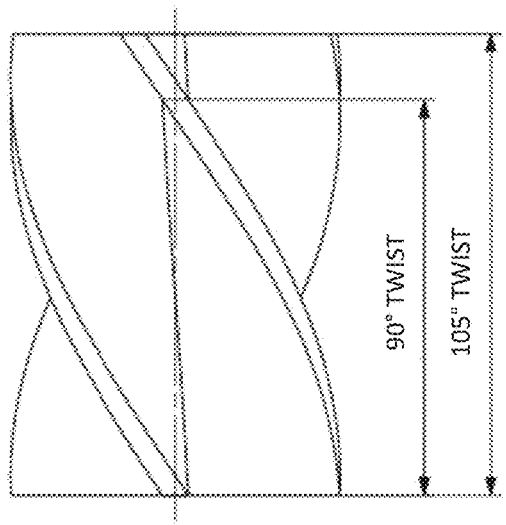
FIGS. 5A and 5B are example schematics of an x-ray shield in accordance with an embodiment of the present disclosure.
Figure 6B:
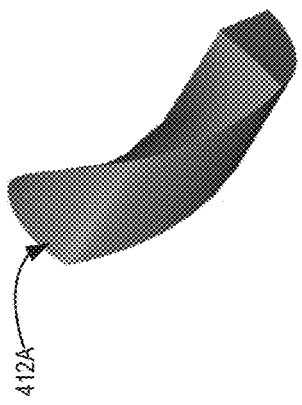
FIGS. 6A and 6B illustrate the empty volume remaining between the example x-ray shield of FIGS. 6A and 6B and vacuum tubing in accordance with an embodiment of the present disclosure.
Figure 5A:
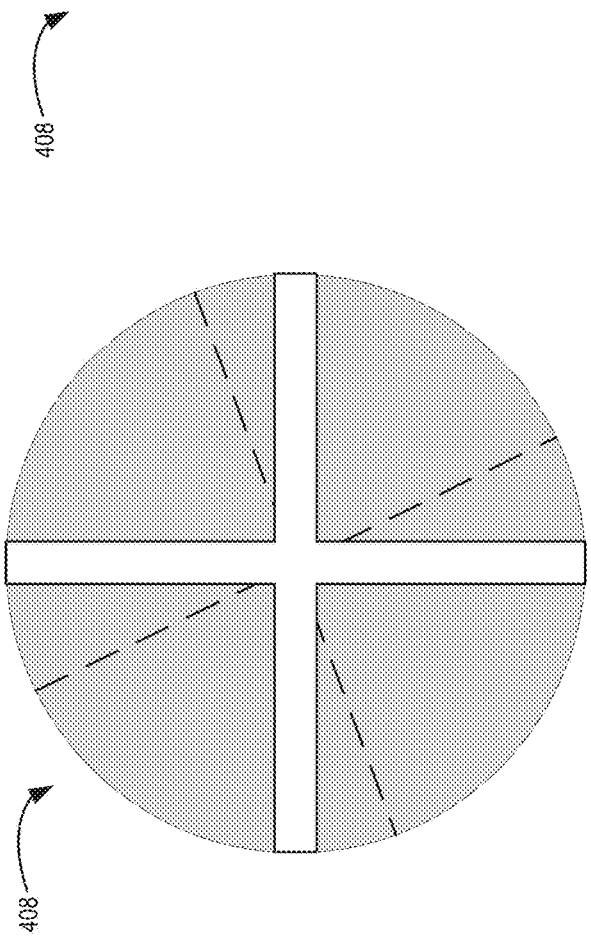

FIGS. 5A and 5B are example schematics of an x-ray shield 508 in accordance with an embodiment of the present disclosure. The x-ray shield 508 may be included in any high vacuum system, such as the system 200, for example. The x-ray shield 508 may be placed in vacuum tubing linking a vacuum chamber and a vacuum pump, and is included to prevent the escape of x-rays from the vacuum chamber while enhancing the pump conductance of the system. Enhancing the pump conductance may allow the system to use weaker pumps to obtain the same desired vacuum, or use the same pumps and obtain the desired pump down in a shorter amount of time or to achieve a better ultimate vacuum pressure.

Figure 6A:
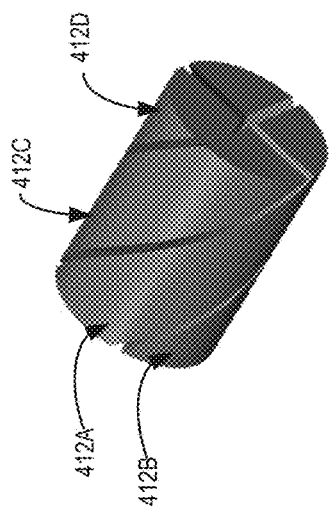

The x-ray shield 508 may be similar to the x-ray shield 308 in many aspects but includes an additional elongate member. For example, the x-ray shield 508 may be formed from two perpendicular semi-flat bars that form a plus-like shape when viewed from one end instead of a single semi-flat bar. Using additional elongate members may allow the degree of twist to be reduced. For example, x-ray shield 408 may be twisted to 105° to achieve a similar amount of x-ray shielding that x-ray shield 308 would obtain when twisted 210°. Using two elongate members instead of one may additionally provide extra x-ray shielding, and further breaks the available volume of space into four intertwined volumes instead of two, see FIGS. 6A, B for example. The intertwined volumes include separate volumes 412A, 412B, 412C, and 412D. In some embodiments, the additional cross of high atomic weight material may allow the thickness of the x-ray shield 508 to be reduced. Reduction of the material thickness may reduce cost and weight while maintaining a desired x-ray protection and vacuum conductance.

The embodiments discussed herein to illustrate the disclosed techniques should not be considered limiting and only provide examples of implementation. For example, an x-ray shield as disclosed herein could include three elongate members formed in a y-shape, or could have more than four members. The different numbers of members, for example, may affect the degree of twist to achieve a desired amount of x-ray shielding, with, in general, less twist needed for additional numbers of elongate members. Those skilled in the art will understand the other myriad ways of how the disclosed techniques may be implemented, which are contemplated herein and are within the bounds of the disclosure.

What is claimed is:

1. An apparatus comprising:
an elongate x-ray shield formed from high atomic weight material shaped into a twist with at least 180° of twist, the elongate x-ray shield disposed within at least a portion of a vacuum tube coupled to a vacuum chamber to prevent at least a portion of x-rays from escaping the vacuum chamber.

2. The apparatus of claim 1, wherein the elongate x-ray shield has 210° of twist.

3. The apparatus of claim 1, wherein the high atomic weight material is lead.

4. The apparatus of claim 1, wherein the high atomic weight material is formed from a material including sintered tungsten particles.

5. The apparatus of claim 1, wherein the elongate x-ray shield is coated in a layer of low atomic weight material.

6. The apparatus of claim 5, wherein the low-z material is aluminum.

7. The apparatus of claim 1, wherein the elongate x-ray shield is biased positively or negatively.

8. The apparatus of claim 1, wherein the elongate x-ray shield is cooled.

9. The apparatus of claim 1, wherein the elongate x-ray shield has a length and a width.

10. The apparatus of claim 9, wherein the width and length are based on an inner diameter and a portion of length of a vacuum tube, the vacuum tube coupling a high vacuum chamber with a vacuum pump.

11. The apparatus of claim 1, further comprising a second elongate x-ray shield arranged perpendicular to the elongate x-ray shield, the second elongate x-ray shield formed from high atomic weight material shaped into a twist.

12. A system comprising:
a vacuum chamber;
a vacuum pump coupled to the vacuum chamber by a vacuum tube; and
an elongate x-ray shield disposed within at least a portion of the vacuum tube, the elongate x-ray shield formed from high atomic weight material shaped into a twist.

13. The system of claim 12, wherein the elongate x-rays shield has at least 180° of twist.

14. The system of claim 12, wherein the elongate x-rays shield has at least 210° of twist.

15. The system of claim 12, wherein the high atomic weight material is lead.

16. The system of claim 12, wherein the high atomic weight material is formed from a material including sintered tungsten particles.

17. The system of claim 12, wherein the elongate x-ray shield is coated in a layer of low atomic weight material.

18. The system of claim 17, wherein the low-z material is aluminum.

19. The system of claim 12, wherein the elongate x-ray shield is biased positively or negatively.

20. The system of claim 12, wherein the elongate x-ray shield is cooled.

21. The system of claim 12, wherein the elongate x-ray shield has a length and a width.

22. The system of claim 12, wherein the vacuum chamber is part of a charged particle microscope.

* * * * *